US008618611B2

(12) United States Patent
Xie et al.

(10) Patent No.: US 8,618,611 B2
(45) Date of Patent: Dec. 31, 2013

(54) ROOM TEMPERATURE CARBON NANOTUBES INTEGRATED ON CMOS

(75) Inventors: Huikai Xie, Gainesville, FL (US); Ant Ural, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 787 days.

(21) Appl. No.: 12/140,132

(22) Filed: Jun. 16, 2008

(65) Prior Publication Data
US 2009/0114901 A1 May 7, 2009

Related U.S. Application Data

(60) Provisional application No. 60/944,083, filed on Jun. 14, 2007.

(51) Int. Cl.
*H01L 51/00* (2006.01)
(52) U.S. Cl.
USPC ........ 257/369; 257/414; 257/E51.04; 438/49; 977/742; 977/957
(58) Field of Classification Search
USPC ...................................................... 257/369
See application file for complete search history.

(56) References Cited

U.S. PATENT DOCUMENTS

| 6,630,772 B1 | 10/2003 | Bower et al. |
| 7,141,727 B1 | 11/2006 | Appenzeller et al. |
| 7,176,147 B2 | 2/2007 | Mori |
| 7,180,107 B2 | 2/2007 | Appenzeller et al. |
| 7,311,776 B2 * | 12/2007 | Lin et al. .................. 117/87 |

OTHER PUBLICATIONS

Li, Y., et al., "Preferential Growth of Semiconducting Single-Walled Carbon Nanotubes by a Plasma Enhanced CVS Method," *Nano Letters*, 2004, pp. 317-321, vol. 4, No. 2.
Jain, A., et al., "An Electrothermally-Actuated, Dual-Mode Micromirror for Large Bi-Directional Scanning," IEEE International Electron Devices Meeting, 2004, pp. 47-50, San Francisco, CA.
Franklin N. R., et al., "Integration of suspended carbon nanotube arrays into electronic devices and electromechanical systems," *Applied Physics Letters*, 2002, pp. 913-915, vol. 81, No. 5.
Choi, Y. et al., "Single-walled carbon nanotube growth from ion implanted Fe catalyst," *Applied Physics Letters*, 2006, 89, 153130.
Ural, Y. et al., "Electric-field-aligned growth of single-walled carbon nanotubes on surfaces," *Applied Physics Letters*, 2002, pp. 3464-3466, vol. 81, No. 18.

(Continued)

*Primary Examiner* — Jerome Jackson, Jr.
(74) *Attorney, Agent, or Firm* — Mark H. Jay

(57) ABSTRACT

Embodiments of the invention integrate carbon nanotubes on a CMOS substrate using localized heating. An embodiment can allow the CMOS substrate to be in a room-temperature environment during the carbon nanotube growth process. Specific embodiments utilize a maskless post-CMOS microelectromechanical systems (MEMS) process. The post-CMOS MEMS process according to an embodiment of the present invention provides a carbon nanotube growth process that is foundry CMOS compatible. The maskless process, according to an embodiment, eliminates the need for photomasks after the CMOS fabrication and can preserve whatever feature sizes are available in the foundry CMOS process. Embodiments integrate single-walled carbon nanotube devices into a CMOS platform.

35 Claims, 3 Drawing Sheets

(56) References Cited

OTHER PUBLICATIONS

Qu H., et al., "A Single-Crystal Silicon Based 3-axis CMOS-MEMS Integrated Accelerometer," *Proc. 3rd IEEE Int'l Conference on Sensors*, 2004, pp. 661-664, Vienna, Austria.

Englander, O., et al., "Local synthesis of silicon nanowires and carbon nanotubes on microbridges," *Applied Physics Letters*, 2003, pp. 4797-4799, vol. 82, No. 26.

* cited by examiner

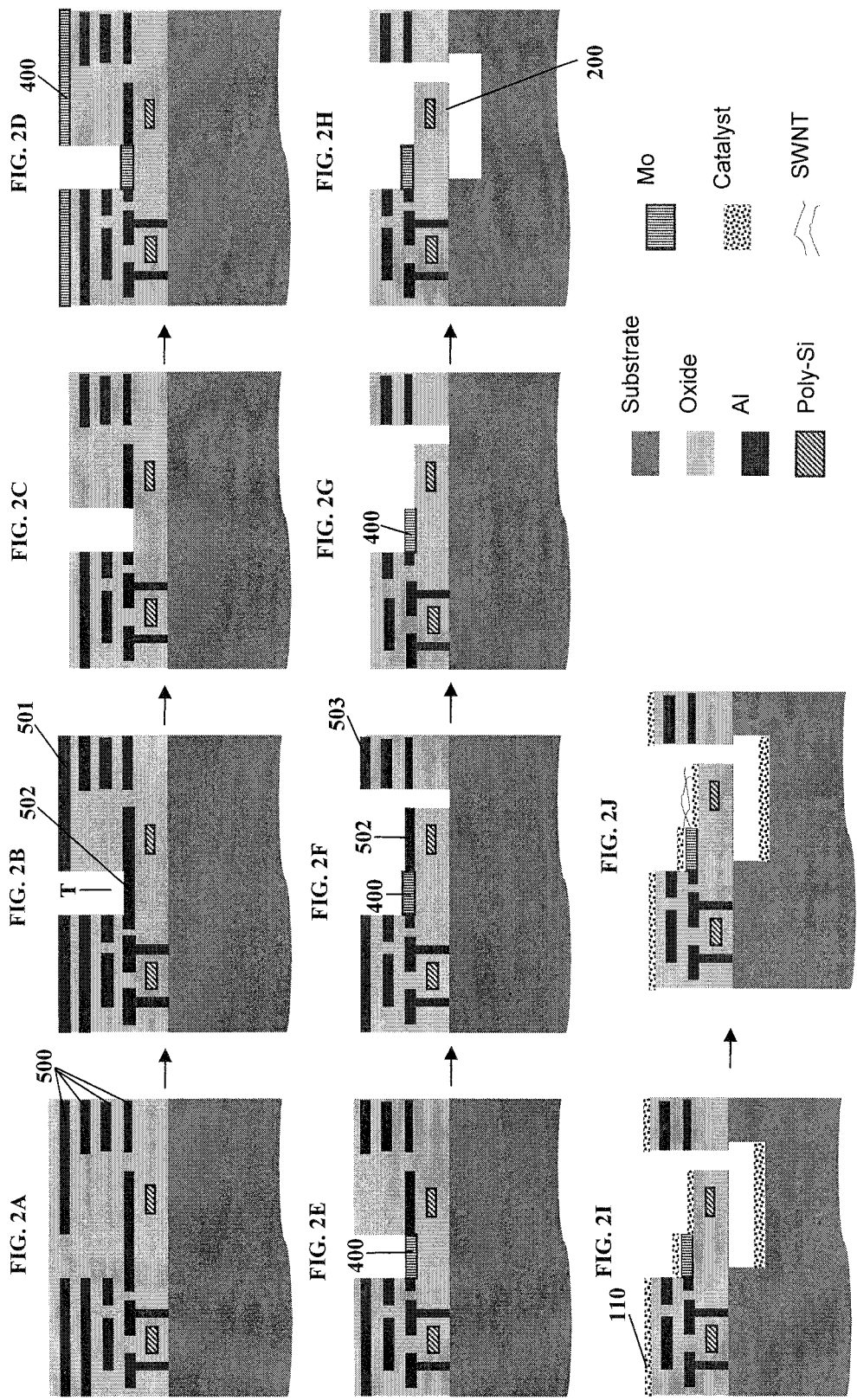

ROOM TEMPERATURE CARBON NANOTUBES INTEGRATED ON CMOS

CROSS-REFERENCE TO RELATED APPLICATION

The present application claims the benefit of U.S. Provisional Application Ser. No. 60/944,083, filed Jun. 14, 2007, which is hereby incorporated by reference herein in its entirety, including any figures, tables, or drawings.

BACKGROUND OF INVENTION

Single-walled carbon nanotubes (SWNTs) have many superior properties suitable for beyond CMOS (complementary metal oxide semiconductor) technology scaling and high-sensitivity chemical and biological sensors. However, the high growth temperatures for SWNTs have inhibited the integration of SWNTs onto a CMOS platform. Although some low-temperature growth methods have recently been reported, compatibility with foundry CMOS processes still remains a challenge. As an example, adding photomasks to the CMOS fabricating process causes technical difficulty and high cost. In addition, interfacing to discrete SWNT devices can be difficult and cumbersome.

Chemical vapor deposition (CVD) appears to be the most promising technique currently available to synthesize single-walled carbon nanotubes (SWNTs) for several reasons: (1) CVD produces pristine, defect-free, and high-quality nanotubes without any by-products such as amorphous carbon; (2) CVD requires no post-growth processing, such as purification, sonication, or filtering; (3) CVD is a well-established technique in the semiconductor industry, such that the existing expertise can easily be transferred and adapted to nanotube growth; and (4) CVD is scalable to larger substrates and wafer sizes.

Despite these advantages, however, a major problem with CVD growth is that it requires high temperatures (typically 800-1000° C.), making it difficult, if not impossible, to integrate CVD SWNTs onto a CMOS platform. As an alternative, plasma enhanced CVD (PECVD) has been used to grow SWNTs at temperatures as low as 600° C. [Li et al., "Preferential growth of semiconducting single-walled carbon nanotubes by a plasma enhanced CVD method," *Nano Letters* 4, 317 (2004)]; however, even this temperature is too high for post-CMOS processing. Also, forming an interface to SWNT devices is often cumbersome.

Recently, room-temperature SWNT growth has been realized using localized resistive heating on thermally isolated microelectromechanical systems (MEMS) structures [Englander et al., "Local synthesis of silicon nanowires and carbon nanotubes on microbridges," *Applied Physics Letters* 82, 4797 (2003)], but this growth method has been limited to non-CMOS substrates because the employed micromachining processes are not compatible with post-CMOS processing. Nanotube growth may be applied before or in between CMOS process steps (i.e., pre-CMOS or intra-CMOS), but would cause serious contamination problems and temperature constraints. Moreover, the requirement of the additional masks for nanotube growth, MEMS fabrication, and thermal isolation would make the fabrication very expensive, especially for prototyping, even in the post-CMOS case.

Accordingly, a fabrication technique that can deposit SWNTs on CMOS substrate and achieve SWNTs-to-CMOS interconnect without the need of any post-CMOS photomasks is desirable.

BRIEF SUMMARY

Embodiments of the invention integrate carbon nanotubes, such as multi-walled carbon nanotubes and/or single-walled carbon nanotubes (SWNTs), on a CMOS (complementary metal oxide semiconductor) substrate using localized heating. As a convenience, and as the growth of SWNTs is an exemplary embodiment of the invention, the growth of the SWNTs will be used to describe various embodiments of the invention, while the description applies also to multi-walled nanotubes. The CMOS substrate can be in an environmental temperature during the growth of the SWNT that is low enough to prevent damage to the CMOS substrate. An embodiment can allow the CMOS substrate to be in a room-temperature environment during the SWNT growth process. Specific embodiments utilize a maskless post-CMOS microelectromechanical systems (MEMS) process. The post-CMOS MEMS process according to an embodiment of the present invention provides a SWNT growth process that is foundry CMOS compatible. In a further specific embodiment, a fabrication technique that can deposit SWNTs on CMOS substrate and achieve SWNTs-to-CMOS interconnect without the need of any post-CMOS photomasks is provided. The maskless process, according to an embodiment, eliminates the need for photomasks after the CMOS fabrication and can preserve whatever feature sizes are available in the foundry CMOS process. As a result, embodiments of the present invention provide gains in functionality and performance by integrating single-walled carbon nanotube devices into a CMOS platform. The development of such nanoscale CMOS-based architectures for applications such as integrated chemical sensors may be important for sustaining CMOS value through functional scaling, multiplexing, and enhancement.

BRIEF DESCRIPTION OF DRAWINGS

FIG. 1A shows a top view, and FIG. 1B shows a cross-sectional view.

FIGS. 2A-2J show various cross-sectional views of a maskless post-CMOS MEMS process flow according to an embodiment of the present invention.

DETAILED DISCLOSURE

Embodiments of the present invention provide integration of nanotube devices in a CMOS process. Embodiments can be used to fabricate, for example, integrated chemical sensors, integrated biological sensors, integrated nanosystems, and other integrated systems.

The CMOS substrate can be maintained at an environmental temperature during the growth of the carbon nanotubes, such as multi-walled carbon nanotubes and/or SWNT, to avoid damage to the CMOS substrate. As a convenience, and as the growth of SWNTs is an exemplary embodiment of the invention, the growth of the SWNTs will be used to describe various embodiments of the invention, while the description applies also to multi-walled nanotubes. Preferably, the environmental temperature is less than or equal to 500° C., more preferably less than 400° C., even more preferably less than 100° C. In an embodiment, processes can be performed at room temperature in a CVD chamber. Localized heating for single-walled carbon nanotubes (SWNTs) can be accomplished while maintaining complementary metal oxide semiconductor (CMOS) compatibility. Thermal isolation can be used to isolate the heat locally produced from certain portions of the CMOS wafer and structures. The post-CMOS fabrication can be maskless. Embodiments can provide integrated interfacing between SWNT and CMOS. In addition, a CMOS integrated SWNT formed according to an embodiment of the present invention can be compact.

According to embodiments of the present invention, a post-CMOS micromachining process is capable of growing SWNTs directly on CMOS substrates at room temperature. This post-CMOS process requires no photomasks, and nanotubes can be grown on selective regions using integrated heaters. This technology can sustain CMOS value even without further scaling, and can be utilized in fabricating various multifunctional integrated nanosystems.

Figure 1A:
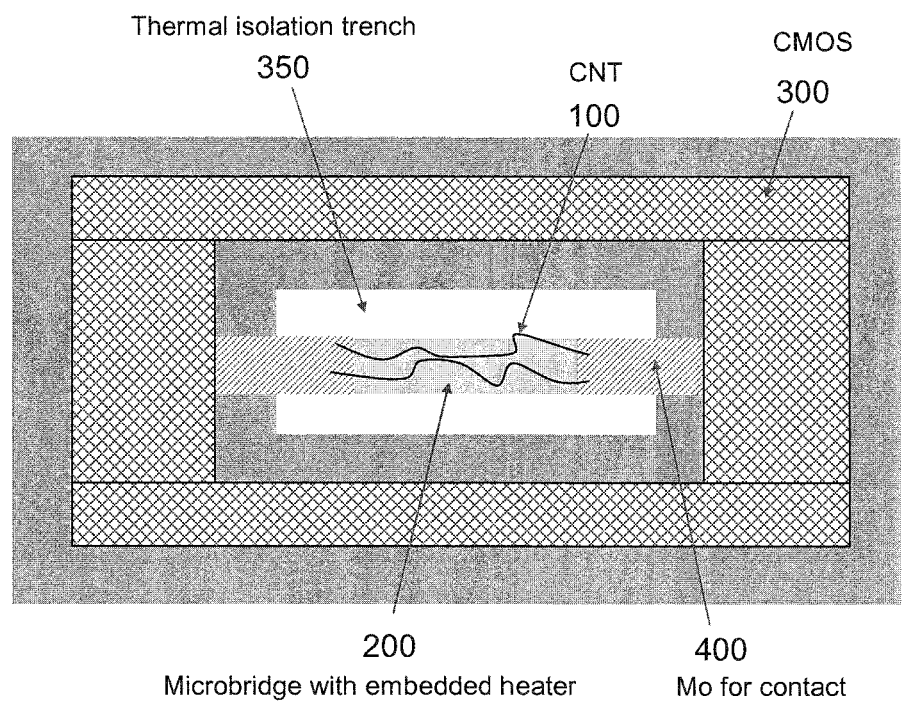
FIGS. 1A and 1B show a CMOS integrated SWNT according to an embodiment of the present invention, where
Figure 1B:
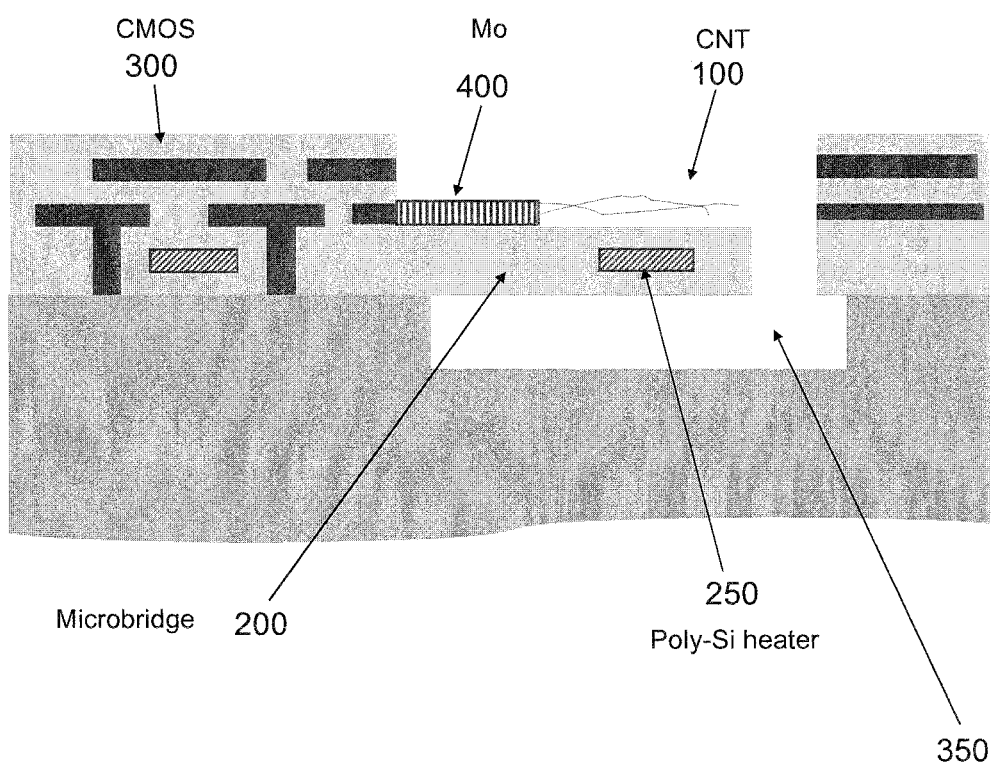

FIGS. 1A and 1B show an embodiment of SWNTs integrated on a CMOS chip. FIG. 1A shows a top view and FIG. 1B shows a cross-sectional view. Referring to FIGS. 1A and 1B, a SWNT integrated CMOS structure can include a carbon nanotube 100 grown on a microbridge 200 with an embedded heater 250. The microbridge 200 can be thermally isolated from structures on a CMOS wafer 300 by a thermal isolation trench 350. Preferably, the thermal isolation trench 350 is open to the gas environment. The carbon nanotubes 100 can be electrically coupled to metal lines on the CMOS wafer 300 by a contact 400 that is formed of a material compatible with nanotube growth, such as molybdenum. The interconnects on the CMOS wafer can be metal or can be other conductive materials, such as polysilicon or nanotubes.

In an embodiment, after a foundry CMOS process that achieves desired CMOS structures 300, MEMS fabrication can be performed to form microbridges 200. The microbridges 200 can be formed well thermally-isolated from the CMOS substrate by, for example, the thermal isolation trench 350. The microbridges 200 can have an embedded heater 250. The embedded heater 250 can be an integrated polysilicon heater. Other materials can be used for the embedded heater such as a metal selected from the group consisting of platinum, tungsten, molybdenum, chromium, copper, and titanium. The embedded heater can raise the temperature in a growth region proximate to the microbridge to a temperature high enough to grow SWNT. In an embodiment, the integrated polysilicon heater 250 can raise the microbridge temperature to at least 800° C. Therefore, the integrated polysilicon heaters 250 can enable the SWNTs 100 to be grown on the locally heated microbridges 200 in a CVD chamber at room temperature. Molybdenum (Mo) is compatible with nanotube growth [see Franklin et al., "Integration of suspended CNT arrays into electronic devices and electromechanical systems," *Applied Physics Letters* 81, 913 (2002)]. Accordingly, in an embodiment, Mo can be deposited as the contact metal before SWNT growth. In further embodiments, other refractory metals can be used as the contact metal before SWNT growth. Preferably, the refractory metal or other conductive material can withstand temperatures high enough to grow the carbon nanotubes, such as higher than 800° C. or higher than 900° C. The Mo can be connected directly with the CMOS interconnect layers, which can be metal or other conductive materials such as polysilicon or nanotubes. All the MEMS fabrication, Mo deposition, catalyst coating, and SWNT growth can be performed after the foundry CMOS process at temperatures lower than 200° C. and without using any photomasks. As a result, embodiments of the nanotube growth technique provide not only a room-temperature process, but also a maskless post-CMOS process.

According to a specific embodiment, polysilicon can be used as an integrated heater, a maskless MEMS fabrication process can be used to create microstructures with proper thermal isolation, and localized heating can be used to reach over 800° C. at selected regions in a room-temperature CVD chamber. The maskless microfabrication can be realized by using the CMOS interconnect metals to form the desired patterns.

FIGS. 2A-2J show various cross-sectional views of a maskless post-CMOS MEMS process flow according to an embodiment of the present invention.

Referring to FIG. 2A, a CMOS die or wafer can be provided. The CMOS wafer can have 4 or more metal layers 500. The metal layers can be formed of aluminum (Al). Referring to FIG. 2B, a dry oxide etch can be performed to form a trench T using the top metal layer 501 as the etching mask. Then, referring to FIG. 2C, a metal etch can be performed to remove the exposed metal of the metal lines 501 and 502. If the metal lines are formed of Al, the metal etch will be an Al etch. Then, a thin layer of a refractory metal 400 (e.g., Mo) is sputtered on the wafer as shown in FIG. 2D. A chemical mechanical polishing (CMP) can be performed to polish the refractory metal layer 400 on the top surface of the wafer, leaving the refractory metal only on the trench bottom as illustrated in FIG. 2E. Next, referring to FIG. 2F, a second oxide etch can be performed using the metal layers 502 and 503 as the etching mask. Then, referring to FIG. 2G, a second dry etch can be performed. The second dry etch can be an Al selective etch such that the refractory metal remains intact while removing the exposed metal lines. After that, a DRIE silicon etch and undercut can be used to form microbridges 200 as shown in FIG. 2H. Referring to FIG. 2I, before SWNT growth, a catalyst mixture 110 can be spun on the wafer, leaving a thin layer of catalyst on the substrate. Such catalysts for SWNT are well known in the art. The catalyst can be iron (Fe) based for SWNT growth, such as for example, described in Choi et al., "Single-walled carbon nanotube growth from ion implanted Fe catalyst," *Applied Physics Letters* 89, 153130 (2006), which is herein incorporated by reference in its entirety. Finally, the CMOS wafer can be placed into a chemical vapor deposition (CVD) chamber for growth of carbon nanotubes, with electrical feedthroughs connected to contacts on the wafer. With an electrical current injected into the polysilicon heater, the elevated temperature on the microbridge will promote the growth of SWNTs as shown in FIG. 2J, whereas the chamber temperature can still be maintained at room temperature. Carbon nanotubes can be grown by exposing the CMOS substrate to gases for the growth of the carbon nanotubes, such as $C_2H_4$ and/or $CH_4$. Other materials can be used for the embedded heater such as a metal selected from the group consisting of platinum, tungsten, molybdenum, chromium, copper, and titanium. The carbon nanotubes will grow where there is high enough temperature, from the embedded heaters, and catalyst. Accordingly, carbon nanotubes will grow in the growth region above the embedded heater on top of the oxide in FIG. 2J. Carbon nanotubes can also grow on the Mo layer if the temperature is high enough and there is catalyst on the Mo layer. In this way, the catalyst and heat can allow the carbon nanotube to grow in such a way as to be in electrical contact with the Mo layer.

Embodiments of the present invention provide a maskless post-CMOS MEMS process suitable for room-temperature SWNT growth on CMOS substrate using integrated localized heating. Embodiments of the maskless post-CMOS MEMS process can be used to fabricate CMOS nanotube-based gas sensors and biosensors. In addition, localized heating using embedded polysilicon heaters may provide the capability to form a CNT FET on CMOS using an embodiment of the disclosed process or a modification. Embodiments of the present invention may provide multi-gas sensor integration with on-chip signal processing circuits.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

REFERENCES

[1] Y. Li, D. Mann, M. Rolandi, W. Kim, A. Ural, S. Hung, A. Javey, J. Cao, D. Wang, E. Yenilmez, Q. Wang, J. F. Gibbons, Y. Nishida, and H. Dai, "Preferential growth of semiconducting single-walled carbon nanotubes by a plasma enhanced CVD method," *Nano Letters* 4, 317 (2004).

[2] Englander, D. Christensen, and L. Lin, "Local synthesis of silicon nanowires and carbon nanotubes on microbridges," *Applied Physics Letters* 82, 4797 (2003).

[3] N. R. Franklin, Q. Wang, T. W. Tombler, A. Javey, M. Shim, and H. Dai, "Integration of suspended CNT arrays into electronic devices and electromechanical systems," *Applied Physics Letters* 81, 913 (2002).

[4] H. Qu, D. Fang, and H. Xie, "Single-Crystal Silicon Based 3-axis CMOS-MEMS Integrated Accelerometer," Proc. 3rd IEEE Int'l Conference on Sensors (*IEEE Sensors '04*), Vienna, Austria, pp. 661-664 (2004).

[5] Jain, S. Todd, and H. Xie, "An Electrothermally-Actuated, Dual-Mode Micromirror for Large Bi-Directional Scanning," *IEDM '04*, San Francisco, Calif., 2004, pp. 47-50 (2004).

[6] Y. Choi, J. Sippel-Oakley, and A. Ural, "Single-walled carbon nanotube growth from ion implanted Fe catalyst," *Applied Physics Letters* 89, 153130 (2006).

[7] Ural, Y. Li, and H. Dai, "Electric-field-aligned growth of single-walled carbon nanotubes on surfaces," *Applied Physics Letters* 81, 3464 (2002).

The invention claimed is:

1. A method of integrating carbon nanotubes and complementary metal oxide semiconductor (CMOS) circuitry, comprising:
   providing a CMOS substrate with a microbridge having an embedded layer of heater material;
   forming a layer of material compatible with carbon nanotube growth proximate to the microbridge, wherein the layer of material compatible with carbon nanotube growth is in contact with one or more interconnect layers on the CMOS substrate;
   activating the embedded heater material so as to raise the temperature in a growth region proximate the microbridge; and
   growing carbon nanotubes in the growth region,
   wherein the carbon nanotubes grown in the growth region do not contact the layer of heater material.

2. The method according to claim 1, wherein growing carbon nanotubes in the growth region comprises growing single-walled carbon nanotubes in the growth region.

3. The method according to claim 1, wherein growing carbon nanotubes in the growth region comprises growing multi-walled carbon nanotubes in the growth region.

4. The method according to claim 1, wherein the CMOS substrate is in an environmental temperature less than 500° C. during growing carbon nanotubes in the growth region.

5. The method according to claim 1, wherein the CMOS substrate is in an environmental temperature less than 100° C. during growing carbon nanotubes in the growth region.

6. The method according to claim 1, wherein the CMOS substrate is at room temperature during growing carbon nanotubes in the growth region.

7. The method according to claim 1, wherein the microbridge is thermally isolated from structures on the CMOS substrate.

8. The method according to claim 7, wherein the microbridge is thermally isolated from structures on the CMOS substrate by a thermal isolation trench.

9. The method according to claim 1, wherein the heater material comprises poly-Si.

10. The method according to claim 1, wherein the heater material comprises a metal selected from the group consisting of: platinum, tungsten, molybdenum, chromium, copper, and titanium.

11. The method according to claim 1, further comprising:
   providing a catalyst in the growth region prior to growing carbon nanotubes.

12. The method according to claim 1, wherein providing a CMOS substrate with a microbridge having an embedded layer of heater material comprises utilizing one or more interconnect layers on the CMOS substrate as a mask for etching dielectrics.

13. The method according to claim 1, wherein providing a CMOS substrate with a microbridge having an embedded layer of heater material comprises utilizing one or more interconnect metal layers on the CMOS substrate as a mask for etching substrate silicon.

14. The method according to claim 1, wherein providing a CMOS substrate with a microbridge having an embedded layer of heater material comprises utilizing one or more dielectric layers on the CMOS substrate as a mask for etching interconnect metals.

15. The method according to claim 1, wherein providing a CMOS substrate with a microbridge having an embedded layer of heater material comprises utilizing one or more dielectric layers on the CMOS substrate as a mask for etching substrate silicon.

16. The method according to claim 1, wherein forming a layer of material compatible with carbon nanotube growth proximate to the microbridge comprises:
   etching portions of at least one of the one or more interconnect layers to form a corresponding at least one etched pit; and
   refilling the at least one etched pit by sputtering a layer of a refractory metal; polishing away portions of the refractory metal on areas other than in the at least one etched pit, wherein the refractory metal layer in the at least one etched pit forms the layer of material compatible with carbon nanotube growth.

17. The method according to claim 16, wherein polishing away portions of the refractory metal comprises chemical-mechanical polishing away portions of the refractory metal.

18. The method according to claim 16, wherein the refractory metal layer in the at least one etched pit provides electrical connection between a first of the one or more interconnect layer and the carbon nanotubes grown.

19. The method according to claim 1, wherein the temperature in the growth region during growing carbon nanotubes is at least 500° C.

20. The method according to claim 1, wherein the temperature in the growth region during growing carbon nanotubes is high enough for the growth of carbon nanotubes.

21. A device, comprising:
a CMOS substrate; and
carbon nanotubes integrated with the CMOS substrate, wherein integrating the carbon nanotubes with the CMOS substrate comprises:
providing a CMOS substrate with a microbridge having an embedded layer of heater material;
forming a layer of material compatible with carbon nanotube growth proximate to the microbridge, wherein the layer of material compatible with carbon nanotube growth is in contact with one or more interconnect layers on the CMOS substrate;
activating the embedded heater material so as to raise the temperature in a growth region proximate the microbridge; and
growing carbon nanotubes in the growth region,
wherein the carbon nanotubes grown in the growth region do not contact the layer of heater material.

22. The device according to claim 21, wherein the device is an integrated biological sensor.

23. The device according to claim 21, wherein the device is an integrated chemical sensor.

24. The device according to claim 21, wherein the device is an integrated nanosystem.

25. The device according to claim 21, wherein the device is a gas sensor.

26. The device according to claim 21, wherein the device is a carbon nanotube field-effect transistor (FET).

27. The device according to claim 21, wherein the device is a sensor.

28. The device according to claim 21, wherein the device is a multi-gas sensor integrated with on-chip signal processing circuits.

29. The device according to claim 27, wherein the heater material that is used for growing carbon nanotubes is also used for the heating source for the sensor.

30. The method according to claim 1, wherein the layer of material compatible with carbon nanotube growth provides electrical connection between a first of the one or more interconnected layers and the carbon nanotubes grown.

31. The method according to claim 1, wherein the CMOS substrate is produced using a foundry CMOS process, wherein providing a CMOS substrate with a microbridge having an embedded layer of heater material is accomplished without the use of any photomasks after the foundry CMOS process, wherein forming a layer of material compatible with carbon nanotube growth proximate to the microbridge is accomplished without the use of any photomasks.

32. The method according to claim 31, wherein the CMOS substrate comprises CMOS structures achieved by the foundry CMOS process, wherein providing a CMOS substrate with a microbridge having an embedded layer of heater material comprises forming the microbridge by performing MEMS fabrication on the CMOS substrate.

33. The method according to claim 18, wherein a second refractory metal layer provides electrical connection between a second of the one or more interconnect layer and the carbon nanotubes grown such that the carbon nanotubes grown, the first refractory metal layer, and the second refractory metal layer electrically interconnect the first of the one or more interconnect layer and the second of the one or more interconnect layer.

34. The device according to claim 30, wherein a second refractory metal layer provides electrical connection between a second of the one or more interconnect layer and the carbon nanotubes grown such that the carbon nanotubes grown, the first refractory metal layer, and the second refractory metal layer electrically interconnect the first of the one or more interconnect layer and the second of the one or more interconnect layer.

35. The method according to claim 1,
wherein providing a CMOS substrate with a microbridge having an embedded layer of heater material comprises:
providing a CMOS substrate with a silicon substrate, one or more polysilicon layers, one or more metal layers, and one or more dielectric layers; and
forming a microbridge over a cavity that is etched into the silicon substrate, wherein the microbridge comprises a first of the one or more polysilicon layers embedded as a heater material and at least one of the one or more dielectric layers, wherein the at least one of the one or more dielectric layers is above, below, or above and below the first of the one or more polysilicon layers.

* * * * *